United States Patent [19]
Nilssen

[11] Patent Number: 5,343,124
[45] Date of Patent: Aug. 30, 1994

[54] SHOCK-HAZARD-FREE LIGHTING MEANS

[76] Inventor: Ole K. Nilssen, Ceasar Dr., Rte. 5, Barrington, Ill. 60010

[21] Appl. No.: 77,260

[22] Filed: Jun. 17, 1993

Related U.S. Application Data

[63] Continuation of Ser. No. 708,985, Mar. 6, 1985, abandoned, and a continuation-in-part of Ser. No. 47,944, Apr. 16, 1993, and Ser. No. 62,329, May 17, 1993, said Ser. No. 47,944, is a continuation-in-part of Ser. No. 955,229, Oct. 1, 1992, which is a continuation-in-part of Ser. No. 607,271, Oct. 31, 1990, which is a continuation-in-part of Ser. No. 787,692, Oct. 15, 1985, which is a continuation of Ser. No. 644,155, Aug. 27, 1984, which is a continuation of Ser. No. 555,426, Nov. 23, 1983, which is a continuation of Ser. No. 178,107, Aug. 14, 1980, said Ser. No. 62,329, is a continuation of Ser. No. 700,049, May 8, 1991, which is a continuation of Ser. No. 489,096, Apr. 27, 1983, which is a continuation-in-part of Ser. No. 178,107, Aug. 14, 1980.

[51] Int. Cl.$^5$ .................. H05B 37/00; H05B 39/00
[52] U.S. Cl. .................. 315/224; 315/127; 307/157; 307/326
[58] Field of Search .............. 315/51, 53, 74, 70, 315/71, 72, 119, 127, 200 R, 219, 224, 225, DIG. 7; 307/150, 151, 157, 326

[56] References Cited

U.S. PATENT DOCUMENTS

| | | | |
|---|---|---|---|
| 4,045,711 | 8/1977 | Pitel . | |
| 4,064,426 | 12/1977 | Tyler | 362/226 |
| 4,104,715 | 8/1978 | Lawson, Jr. | 315/224 X |
| 4,300,073 | 11/1981 | Skwirut . | |
| 4,426,587 | 1/1984 | Nouet | 307/150 X |
| 4,464,607 | 8/1984 | Peil et al. | 315/DIG. 7 |
| 4,507,698 | 3/1985 | Nilssen | 315/DIG. 7 |
| 4,943,886 | 7/1990 | Quazi | 307/326 X |
| 5,070,522 | 12/1991 | Nilssen | 307/157 X |

OTHER PUBLICATIONS

McGraw-Hill *Encyclopedia of Science and Technology*, vol. 7, (1978), pp. 56 to 59.
*National Electrical Code Handbook*, 1984, National Fire Protection Association, Article 725.

*Primary Examiner*—David Mis

[57] ABSTRACT

A power supply is integrally combined with a power plug, and the combination is adapted to be plugged into an ordinary household electrical outlet and operable to provide a power-line-isolated output of 120 Volt RMS at a frequency of about 30 kHz. The Volt-Ampere product available from this power supply is limited to be no more than 100 Volt-Ampere. Due to the high frequency, the electric shock hazard associated with this 120 Volt/30 kHz power supply is not higher than it is for a power supply having a voltage of only 30 Volt RMS at 60 Hz. The power supply, which also has receptacle means operable to receive and hold an ordinary electric power plug, is adapted to be interposed between an ordinary household electrical outlet and the power plug of an ordinary table lamp. Thus, while ordinary 120 Volt incandescent light bulbs may effectively be used in the socket of this table lamp, the socket voltage—even though being of 120 Volt RMS magnitude—is substantially free from serious electric shock hazard due to its high frequency.

16 Claims, 1 Drawing Sheet

SHOCK-HAZARD-FREE LIGHTING MEANS

RELATED APPLICATIONS

This application is a continuation of Ser. No. 06/708,985 filed Mar. 6, 1985, now abandoned.

This application is also a continuation-in-part of Ser. No. 08/047,944 filed Apr. 16, 1993; which is a continuation-in-part of Ser. No. 07/955,229 filed Oct. 1, 1992; which is a continuation-in-part of Ser. No. 07/607,271 filed Oct. 31, 1990; which is a continuation-in-part of Ser. No. 06/787,692 filed Oct. 15, 1985; which is a continuation of Ser. No. 06/644,155 filed Aug. 27, 1984; which is a continuation of Ser. No. 06/555,426 filed Nov. 23, 1983; which is a continuation of Ser. No. 06/178,107 filed Aug. 14, 1980.

This application is also a continuation-in-part of Ser. No. 08/062,329 filed May 17, 1993; which is a continuation of Ser. No. 07/700,049 filed May 8, 1991; which is a continuation of Ser. No. 06/489,096 filed Apr. 27, 1983; which is a continuation-in-part of Ser. No. 06/178,107 filed Aug. 14, 1980.

BACKGROUND OF THE INVENTION

1. Field of Invention

The present invention relates to lighting means having sockets operable to receive and power 120 Volt incandescent light bulbs but wherein the socket voltage is conditioned such as to make it substantially free from electric shock hazard.

2. Background and Prior Art

According to Article 725 of NATIONAL ELECTRICAL CODE 1984—issued by NATIONAL FIRE PROTECTION ASSOCIATION, BATTERYMARCH PARK, QUINCY, MASS. 02269—as long as output current may exceed 0.005 Amp, a Class-2 electrical circuit is limited to a maximum output voltage of 30 Volt RMS for sinusoidal voltages at power line frequencies. Based on experience, this voltage level is considered to be acceptably safe from electric shock hazards.

A wide variety of plug-mounted Class-2 power supplies are available for purchase. A typical example of such a power supply is a plug-in battery eliminator for a hand-held calculator.

At frequencies substantially higher than 60 Hz, the human body exhibits a significant degree of so-called skin-effect; which causes less penetration of current into the human body while at the same time making the human body more resistive to the flow of current.

For instance, at a frequency of 60 Hz, it is relatively harmless for a person to receive an electric shock that results in a current as high as 0.005 Amp. At 30 kHz, on the other hand, it is about equally harmless for a person to receive an electric shock that results in a current as high as 0.03 Amp.

SUMMARY OF THE INVENTION

Objects of the Invention

One object of the present invention is that of providing a lighting means having a socket operable to receive and power a 120 Volt incandescent lamp but yet being substantially free from serious electric shock hazard.

Another object is that of providing lighting means that are substantially safe from electric shock hazard and/or from fire initiation hazard.

These as well as other important objects and advantages of the present invention will become apparent from the following description.

Brief Description

In its preferred embodiment, subject invention comprises a frequency converting power supply combined with a power plug, with the combination being an integral entity suitable for insertion into and support by an ordinary household electrical outlet. Comprised within this power supply is a full bridge rectifier, a 30 kHz inverter, an isolating voltage transformer, and a current-limiting means. The power-line-isolated current-limited 30 kHz output from the overall power supply is provided at a receptacle adapted to receive a power plug of the type that ordinarily plugs into a regular household electrical receptacle.

The RMS magnitude of the 30 kHz output voltage is about 120 Volt. Because the frequency is so much higher than 60 Hz, the electric shock hazard associated with the 120 Volt/30 kHz output is no worse than that associated with a regular Class-2 30 Volt/60 Hz output. Consequently, since the output is also current-limited such that no more than 100 Volt-Ampere can be provided, the output from the power supply may be considered free of both electric shock hazard and fire-initiation hazard, thereby providing all the safety features normally associated with Class-2 electrical circuits.

The plug-mounted power supply is interposed between an ordinary household electric power outlet and the power plug of an ordinary table lamp, thereby providing 120 Volt/30 kHz voltage at the socket of that table lamp. In this lamp socket, any regular 120 Volt incandescent lamp up to about 100 Watt may now properly be used; yet, the lamp socket may now be considered free from electric shock hazard. This means, for instance, that a child may stick a finger into the live lamp socket without thereby getting a potentially dangerous electrical shock. Moreover, because of the power-limitation, the power cord of the table lamp may now safely be made particularly light of weight and especially flexible.

DESCRIPTION OF THE PREFERRED EMBODIMENT

Details of Construction

Figure 1:
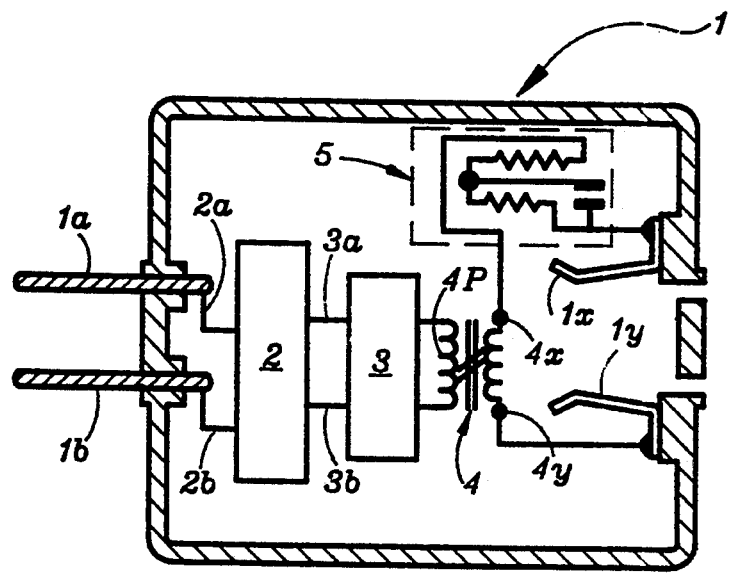
FIG. 1 provides a schematic circuit diagram of the preferred embodiment of the plug-mounted power supply.

In FIG. 1, a plug-mounted power supply is designated by the numeral 1. Rigidly attached to this power supply are two prongs 1a and 1b; which prongs are so sized and positioned as to permit the overall power supply to be plugged into and supported by an ordinary household electrical outlet—such as element 25 in FIG. 2.

Connected with prongs 1a and 1b are terminals 2a and 2b of rectifier means 2. The DC output of this rectifier is applied to power input terminals 3a and 3b of an inverter 3. The relatively high frequency output voltage of this inverter is applied to the primary winding 4P of a transformer 4.

This transformer has a secondary winding having terminals 4x and 4y. Terminal 4y is directly connected with power supply output terminal 1y. Terminal 4x is connected with power supply output terminal 1x by way of current limiting means 5.

Figure 2:
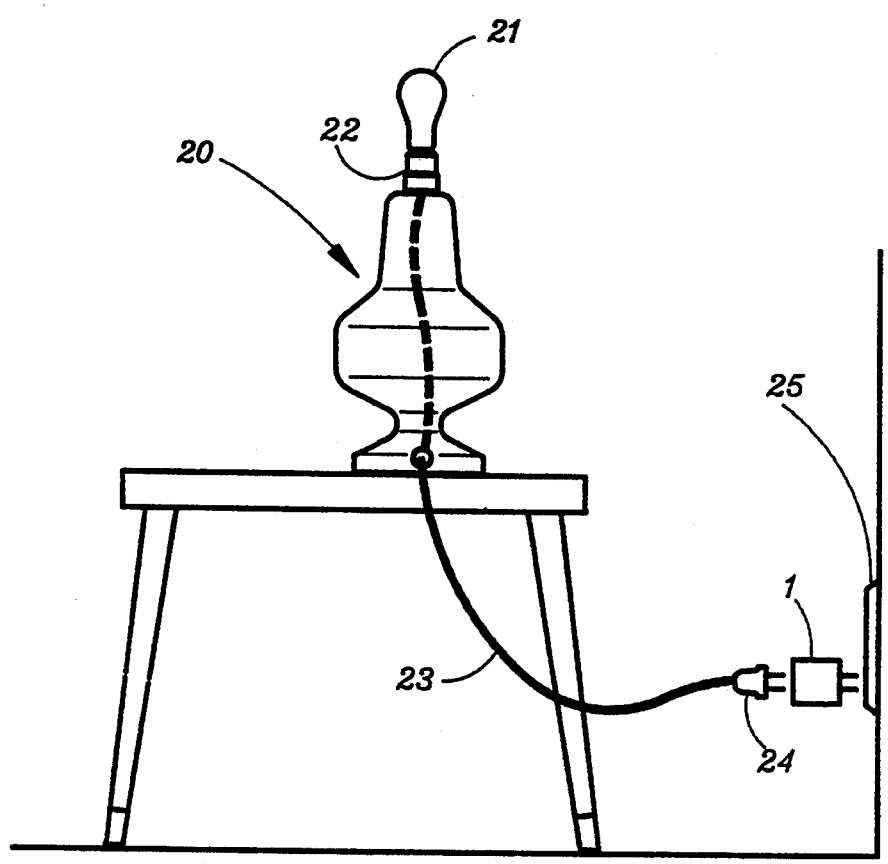
FIG. 2 illustrates the preferred embodiment of the overall invention.

The two power supply output terminals are so arranged as to be able to receive, hold and connect with an ordinary household electric power plug—such as element 24 in FIG. 2.

FIG. 2 illustrates how the power supply of FIG. 1 is used in the invention, and shows a table lamp 20 having an ordinary lamp socket 22 adapted to receive an ordinary Edison-type incandescent lamp 21. The table lamp has a power cord 23 and an ordinary household electrical power plug 24.

Plug-in power supply 1 is shown in a position ready to be plugged into household electrical receptacle 25; and power plug 24 is shown in a position ready to be plugged into and connect with power supply 1.

Details of Operation

When the power supply of FIG. 1 is plugged into an ordinary electrical receptacle, 120 Volt/60 Hz power line voltage is applied to terminals 1a and 1b, rectified by rectifier 2, applied in the form of a DC voltage to inverter 3, and provided in the form of a 30 kHz non-current-limited squarewave voltage to the primary winding 4P of transformer 4.

When non-loaded, the output at the secondary winding of transformer 4 is a 30 kHz squarewave voltage of RMS magnitude approximately equal to 120 Volt. To meet with requirements of the National Electrical Code for Class-2 circuits, the maximum current available from this secondary winding must be limited in such a way that the maximum Volt-Ampere product extractable from terminals 4x and 4y is no more than 250 Volt-Ampere.

This degree of power limitation is provided for by magnetic flux leakage in transformer 4; which is so designed as not to be capable of providing a short circuit current of more than about 8 Amp. (As an alternative, this or any other suitable degree of current-limitation may readily be provided by way of adding an inductor in series with one of the output terminals of the secondary winding.)

The power from the secondary winding of transformer 4 is provided to the power supply output terminals 1x and 1y by way of another and much more sensitive current-limiting means 5. This current-limiting means is a thermally responsive bimetallic circuit breaker; which circuit breaker is actuated by heat generated by the current flowing through the circuit breaker. So as to meet with the requirements of the National Electrical Code, this circuit breaker has been made such as to break the circuit at a current flow of about 0.8 Amp.

Thus, the plug-in/plug-into power supply 1 of FIG. 1 is capable of providing approximately 120 Volt RMS to loads requiring currents as high as 0.8 Amp. Yet, due to the high frequency of the output voltage, this power supply is effectively as safe from electrical shock hazard as if the output voltage were to be only 30 Volt at 60 Hz.

FIG. 2 illustrates the overall invention by way of showing the power supply of FIG. 1 interposed between a regular household electrical outlet and the power plug of a regular table lamp, thereby to provide substantially shock-hazard-free 120 Volt voltage to the lamp socket of that table lamp; which now permits a regular 120 Volt incandescent lamp up to about 100 Watt rating to be effectively used in the lamp socket thereof. Yet, this lamp socket may now be considered safe from electric shock hazard.

In substantial conformance with the National Electrical Code, as well as with the specifications of Underwriters Laboratories Inc. of Northbrook, Ill. 60062, a Class-2 power supply (or a Class-2 transformer, circuit arrangement, etc.) is herewith defined as a power supply having an output that is safe from fire initiation hazard as well as from electric shock hazard, even if a person were to make direct electrical contact with the output.

In substantial conformance with the National Electrical Code, as well as with the specifications of Underwriters Laboratories Inc. of Northbrook, Ill. 60062, a Class-3 power supply is herewith defined as a power supply having an output that is safe from fire initiation hazard but not necessarily safe from electric shock hazard.

Applicant has verified by actual tests that a current flow through the human body of over 0.03 Amp at a frequency of about 30 kHz can not reasonable be regarded as an electric shock, and definitely not a dangerous electric shock. In this connection, it is noted that Underwriters Laboratories prescribes the use of a 500 Ohm resistor to simulate the overall resistance of a human body when exposed to a voltage of 60 Hz frequency. This implies that, at a voltage of 120 Volt, the resulting current would be 0.024 Amp; which is less than the previously defined limit of 0.03 Amp at 30 kHz. In this connection, it should be recognized that at 30 kHz the equivalent resistance of the human body would have to be considered as being a good deal higher than than it is at 60 Hz.

In the power supply of FIG. 1, it is noted that the bridge rectifier 2 and the inverter 3 are both conventional in construction. Thus, the voltage and current limitation associated with the power supply's output is accomplished in a substantially non-dissipative fashion, a feature that is in direct contrast with ordinary Class-2 power supplies.

It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

I claim:

1. An arrangement comprising:
   a pair of prongs adapted to be inserted into and held by an ordinary household electrical outlet;
   rectifier means connected with the pair of prongs and, provided said prongs are indeed inserted into said electrical outlet, operative to provide a DC voltage at a DC output;
   inverter means connected with the DC output and operative to provide a high-frequency output voltage at an inverter output; the fundamental frequency of the high-frequency output voltage being at least two times higher than that of the power line voltage ordinarily present at an ordinary electric utility power line;
   a pair of power supply output terminals;

current limiting means connected in circuit between the inverter output and the power supply output terminals; the current limiting means being operative to prevent the magnitude of any current drawn from the power supply output terminals from exceeding: (i) a first predetermined level for longer than a first brief period of time, and (ii) a second predetermined level for longer than a second brief period of time; the first predetermined level being higher than the second predetermined level by a factor of at least 1.5; the first brief period of time being shorter than the second brief period of time by a factor of at least 1.5; and lamp means disconnectably connected with the power supply output terminals.

2. The arrangement of claim 1 including receptacle means operative to receive and hold an ordinary household power plug; the receptacle means having a pair of receptacle terminals connected with the power supply output terminals.

3. The arrangement of claim 1 wherein the lamp means includes an ordinary 120 Volt Edison-type incandescent lamp.

4. The arrangement of claim 1 wherein the current limiting means includes a reactance means operative to prevent the magnitude of any current drawn from the power supply output terminals from exceeding said first predetermined level.

5. An arrangement comprising:

rectifier means connected with the power line voltage of an ordinary electric utility power line and operative to provide a DC voltage at a DC output;

inverter means connected with the DC output and operative to provide a high-frequency output voltage an inverter output; the fundamental frequency of the high-frequency output voltage being at least twice as high as that of the power line voltage;

a pair of power supply output terminals;

first and second current limiting means connected in circuit between the inverter output and the power supply output terminals; the first current limiting means being operative to prevent the magnitude of any current drawn from the power supply output terminals from exceeding a first level; the second current limiting means being operative to prevent the magnitude of any current drawn from the power supply output terminals from exceeding a second level for longer than a brief period of time; the first level being higher than the second level by a factor of at least 1.5; and lighting means disconnectably connected with the power supply output terminals.

6. The arrangement of claim 5 wherein the first level is higher than the second level by at least a factor of two.

7. The arrangement of claim 5 wherein the lighting means includes an ordinary 120 Volt Edison-type incandescent lamp.

8. The arrangement of claim 5 wherein the maximum amount of power extractable from the power supply output terminals is limited such as not to constitute a fire initiation hazard.

9. An arrangement comprising:

an ordinary electric utility power line providing a power line voltage across a pair of power line terminals; the maximum power extractable from the power line terminals being in excess of a first level;

a rectifier circuit connected with the power line terminals and operative to provide a DC voltage at a pair of DC terminals; the maximum power extractable from the DC terminals also being in excess of said first level;

a power supply circuit connected with the DC terminals and operative to provide an AC voltage a pair of AC output terminals; the frequency of the AC voltage being higher than that of the power line voltage by a factor of at least two; the power supply circuit being further characterized by including circuitry functional to prevent: (i) the maximum power extractable from the AC output terminals from exceeding a second level, which second level being lower than the first level by a factor of at least ten; and (ii) the power extractable from the AC output terminals from exceeding a third level for longer than a brief period of time, the third level being lower than the second level by a factor of at least 1.5; and lighting means disconnectably connected with an AC output terminals.

10. The arrangement of claim 9 further characterized in that the third level is no higher than about 100 Watt and the second level is substantially higher than 100 Watt.

11. The arrangement of claim 10 wherein the second level is no higher than about 250 Watt.

12. The arrangement of claim 9 wherein the power supply circuit is additionally characterized by including a transformer having a primary winding and a secondary winding; the secondary winding being coupled loosely with the primary winding, thereby being operative to prevent the maximum power extractable from the AC output terminals from exceeding said second level.

13. The arrangement of claim 12 wherein the transformer is characterized by exhibiting a substantive amount of magnetic flux leakage between the primary winding and the secondary winding.

14. The arrangement of claim 9 wherein the lighting means is characterized by including an incandescent lamp.

15. The arrangement of claim 9 wherein the lighting means is characterized by being disconnectably connected with the AC output terminals by way of a power plug and a corresponding receptacle.

16. The arrangement of claim 9 wherein the lighting means is connected with the AC output terminals by way of a power cord having an ordinary household electrical power plug at one of its ends.

* * * * *